United States Patent [19]

Okamoto et al.

[11] Patent Number: 5,672,414

[45] Date of Patent: Sep. 30, 1997

[54] MULTILAYERED PRINTED BOARD STRUCTURE

[75] Inventors: Kenji Okamoto; Yukio Nakajima; Kazuhiko Imamura; Takao Ichihara, all of Kanagawa, Japan

[73] Assignee: Fuji Electric Co., Ltd., Kanagawa, Japan

[21] Appl. No.: 263,332

[22] Filed: Jun. 21, 1994

[30] Foreign Application Priority Data

Jun. 25, 1993 [JP] Japan .................................. 5-180836
Mar. 18, 1994 [JP] Japan .................................. 6-074402
May 10, 1994 [JP] Japan .................................. 6-095985

[51] Int. Cl.$^6$ ........................................................ B32B 9/00
[52] U.S. Cl. .......................... 428/209; 428/901; 361/761; 361/792; 361/720
[58] Field of Search ............................ 428/209, 210, 428/901; 361/746, 761, 792, 752, 720, 749

[56] References Cited

U.S. PATENT DOCUMENTS

| | | | |
|---|---|---|---|
| 2,923,860 | 2/1960 | Miller | 361/720 |
| 3,436,604 | 4/1969 | Hyltin | 361/792 |
| 3,699,394 | 10/1972 | Schuler | 317/100 |
| 3,746,934 | 7/1973 | Stein | 361/792 |
| 4,368,503 | 1/1983 | Kurosawa et al. | 361/414 |
| 4,496,793 | 1/1985 | Hanson et al. | 174/68.4 |
| 4,584,767 | 4/1986 | Gregory | 29/848 |
| 4,635,356 | 1/1987 | Ohuchi et al. | 29/841 |
| 4,640,010 | 2/1987 | Brown | 361/792 |
| 4,858,073 | 8/1989 | Gregory | 361/792 |
| 4,879,630 | 11/1989 | Boucard et al. | 361/386 |
| 5,255,157 | 10/1993 | Hegel | 361/761 |
| 5,290,971 | 3/1994 | Hamaguchi | 361/749 |
| 5,299,094 | 3/1994 | Nishiro | 361/761 |
| 5,375,039 | 12/1994 | Wiesa | 361/720 |
| 5,377,079 | 12/1994 | Morita | 361/752 |

FOREIGN PATENT DOCUMENTS

| | | |
|---|---|---|
| 0 521 343 A1 | 1/1993 | European Pat. Off. . |
| 2 336 024 | 7/1977 | France . |
| 81673 | 5/1971 | Germany . |
| 8219553 U | 10/1982 | Germany . |
| 3412265A1 | 10/1985 | Germany . |
| 8600928 U | 7/1987 | Germany . |
| 3500303C2 | 5/1990 | Germany . |
| 3942392A1 | 6/1990 | Germany . |
| 3933124A1 | 4/1991 | Germany . |
| 4108986A1 | 9/1991 | Germany . |
| 4017181A1 | 12/1991 | Germany . |
| 4031733A1 | 4/1992 | Germany . |
| 4035526A1 | 5/1992 | Germany . |
| 4215084A1 | 11/1992 | Germany . |
| 9308843 U | 9/1993 | Germany . |
| 4220966A1 | 1/1994 | Germany . |
| 62-53827 | 3/1987 | Japan . |
| 4-6893 | 1/1992 | Japan . |
| 4-332188 | 11/1992 | Japan . |
| 6-53621 | 2/1994 | Japan . |
| 970737 | 10/1982 | U.S.S.R. . |

*Primary Examiner*—Patrick J. Ryan
*Assistant Examiner*—Patrick R. Jewik
*Attorney, Agent, or Firm*—Finnegan, Henderson, Farabow, Garrett & Dunner, L.L.P.

[57] ABSTRACT

A metallic printed board is formed by laminating an insulation layer on the surface of a metallic sheet as a base, and then electronic parts are mounted on the conductor pattern formed on the surface of the insulation layer. A double-sided printed board mounted thereon electronic parts is placed in parallel. Both the printed boards are supported and fixed monolithically by filling the space between the printed boards with an insulation resin and curing the resin. Furthermore, an insulation resin is laminated on the surface of the printed board in such a manner that the resin may cover the mounted electronic parts, and cured. The heat generated from the electronic parts can be efficiently transmitted to the insulation resins by using a resin having a high thermal conductivity for both of the insulation resins, and the heat is then emitted from the surfaces of the metallic sheet or the insulation resin.

24 Claims, 5 Drawing Sheets

MULTILAYERED PRINTED BOARD STRUCTURE

BACKGROUND OF THE INVENTION

The present invention relates to a multilayered metallic printed board for mounting electronic parts such as resistors, capacitors, and IC chips at a high density, and to a molded module fabricated by joining a multilayer-type package obtained by forming the multilayered metallic printed board into a box-shape etc., with a printed board provided as a mother board, and then monolithically molding the joint structure using an insulation resin.

Known printed boards devised for achieving a higher mount density of electronic parts include a metallic printed board comprising a metallic base provided with two or more types of insulation layers thereon and further with a conductor pattern formed on the layers, and a three-dimensionally shaped metallic printed board obtained by subjecting the metallic printed board to a bending or drawing process.

For instance, an Unexamined Japanese Patent Publication No. Hei-4-332188 discloses the above described metallic printed board having a higher mount density, which comprises insulation layers each differing from each other according to the characteristics of the electric circuits mounted thereon.

However, the maximum mount density achieved so far is not always sufficiently high, because the maximum density for mounting the electronic parts has been limited in the prior art metallic printed boards since the parts are mounted on a single plane.

Moreover, the insulation layers of the metallic printed boards have been formed on copper foils or metallic boards by first applying a polyamic acid varnish as a precursor for a thermoplastic polyimide or a thermoplastic polyimide varnish, either by a casting process or coating process, and then adhering the foils or the boards together with or without incorporating an insulation sheet between them. Such a process for fabricating metallic printed boards requires special skill and complicated process steps.

In case of mounting the parts after subjecting the metallic printed boards to bending and drawing processes, the mounting operation has to be applied to relatively deep portions. This makes surface mounting difficult; hence, the process yields poor productivity and is therefore not suitable for mounting irregularly shaped parts at a high density.

Furthermore, in case of applying the drawing step, the insulation layer in the corner portions also undergoes drawing. The depth of drawing is therefore limited because if the drawing is too deep, the insulation layer is destroied. Thus, it has been found impossible to form thick metallic printed boards, and hence, parts can not be formed in a multilayered structure. Accordingly, such a process has been found unsuitable for increasing the mounting density.

In case an electronic part such as an IC which undergoes switching operation at high speed is directly mounted on a metallic printed board having a thin insulation layer, it may malfunction due to the crosstalk within the electronic circuit or due to the exterior noise because of the high static capacitance of the insulation layer. Thus, the insulation layer is preferably formed as thick as possible. On the other hand, the structure of a package formed by subjecting a metallic printed board to a bending or drawing process requires that the heat generated by the electronic parts inside the structure is discharged as efficiently as possible to minimize the heat loss. In case of further mounting bare chips inside the package, it is also desired to assure the protection of the electronic parts against corrosion by environment and the like.

In addition, it is not always easy to join the package to a mother board at high precision and by a simple process. Moreover, the joint thus obtained after joining the package to the mother board has been found to be insufficiently reliable due to the physical properties of the material.

SUMMARY OF THE INVENTION

The present invention has been accomplished to overcome the aforementioned problems. An object of the present invention is, accordingly, to provide a multilayered metallic printed board and a molded module which can be easily fabricated with high productivity and can mount various types of parts at high density, and which are highly reliable both in electric and mechanical properties.

The aforementioned object has been accomplished by a multilayered metallic printed board according to the present invention, which comprises a metallic printed board formed by laminating an insulating layer on a metallic sheet as a base and having electronic parts mounted thereon, and one or more printed boards each having electronic parts thereon and being laminated over the part-mounted side of the metallic printed board, the space between the boards being filled with an insulation resin.

Further, a molded module according to the present invention comprises a printed board as a mother board having electronic parts mounted thereon and a multilayered package formed by folding an outer edge of the multilayered metallic printed board and filling the inside thereof with an insulation resin. The entire structure is formed monolithically by joining the printed board as the mother board with the multilayered package, and then filling around the joinded portion and the space between the printed board as the mother board and the multilayered package with an insulation resin.

According to the multilayered metallic printed board of the present invention, the electronic parts can be mounted on a plurality of layers to increase the mount density of the parts, and the heat radiated from each of the parts can be efficiently discharged via the insulation resin layer and the metallic sheet.

According to the molded module of the present invention, the electronic parts are mounted on each of the printed board as a mother board, the metallic printed board of the multilayered package joined with the mother board, and the printed board inside the package. Thus, the parts constitute a layered structure to increase the mount density of the parts in the molded module which is formed of the integration of each of the boards. Further, the periphery of each of the mounted parts can be filled with the insulation resin and sealed in this manner. Thus, the heat generated from each of these parts can be efficiently discharged via the insulation resin, the metallic printed boards, etc., while each of the parts are protected from the outer moisture and various atmospheres.

DETAILED DESCRIPTION OF THE PREFERRED EMBODIMENTS

Preferred embodiments of the present invention will be described in detail below referring to the attached drawings.

Figure 1:
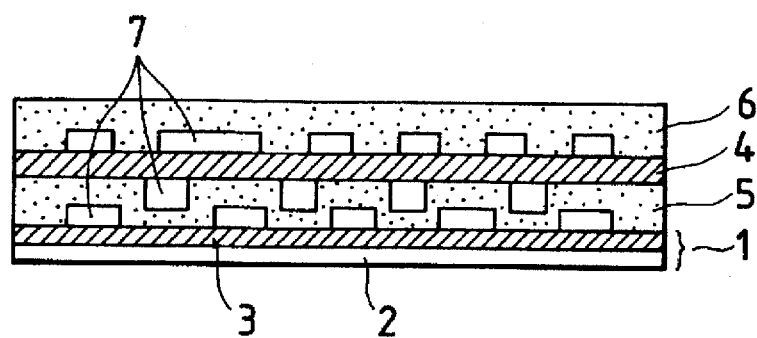
FIG. 1 is a cross sectional view showing a multilayered metallic printed board according to a first embodiment of the present invention.

FIG. 1 is a cross sectional view showing a multilayered metallic printed board according to a first embodiment of the present invention.

In FIG. 1, a metallic printed board 1 is formed of a metallic sheet 2 as a base and an insulation layer 3 laminated on the upper surface of the metallic sheet 2. Although not shown in the drawing; conductor patterns are provided on the upper surface of the insulation layer 3 and electronic parts 7 are mounted thereon.

A double-sided printed board 4 is disposed over the metallic printed board 1 in parallel. Although not shown in the drawing, conductor patterns are provided on both surfaces of the board 4 and electronic parts 7 are mounted thereon.

The space between the metallic printed board 1 and the double-sided printed board 4 is filled with an insulation resin 5. The insulation resin is cured to support and monolithically fix both the boards.

An insulation resin 6 is further laminated on the upper surface of the double-sided printed board 4 in such a manner that it may cover the mounted electronic parts 7.

In this embodiment, the double-sided printed board 4 is placed over the metallic printed board 1 and arranged in parallel with it. As a result, the electronic parts are mounted on three layers to increase the mount density of the parts. On the other hand, the amount of heat generation per unit area due to the presence of the electronic parts 7 also increases with the elevation of the mount density. However, since the insulation resins 5 and 6 are placed in the periphery of the electronic parts 7, the heat thus generated can be efficiently transferred and absorbed by the insulation resins 5 and 6, and then discharged efficiently to the outside from the surface of the lower metallic sheet 2 or the surface of the upper insulation resin 6. Thus, the temperature of the electronic parts 7 can be maintained at a constant level or lower.

The insulation resins 5 and 6 may differ from each other in thermal conductivity, but preferably, they are resins having high values of thermal conductivity.

The printed board laminated over the metallic printed board 1 may be a single sided board, or may be a laminate of two or more boards.

Figure 2:
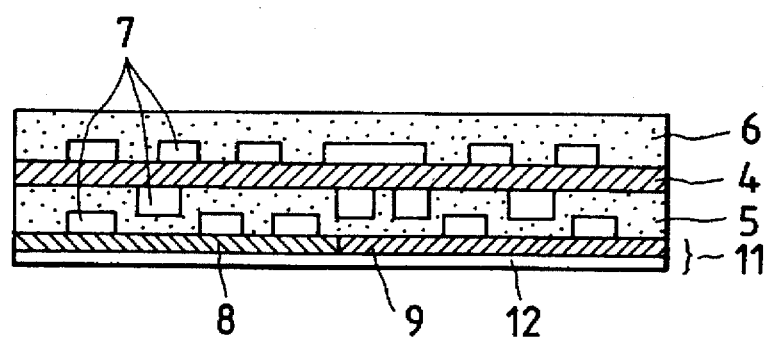
FIG. 2 is a cross sectional view showing a multilayered metallic printed board according to a second embodiment of the present invention.

FIG. 2 is a cross sectional view showing a multilayered metallic printed board according to a second embodiment of the present invention.

This embodiment is characterized in a metallic printed board, and the other portions are the same as in the structure shown in FIG. 1. Accordingly, the common parts are indicated with the same symbols used in FIG. 1 to refer to them without explanation. In FIG. 2, a metallic printed board 11 comprises a metallic sheet 12 as a base. The upper surface of the metallic sheet 12 is separated into two portions, and two insulation layers 8 and 9 differing from each other in physical properties are laminated on the two portions. The insulation layers 8 and 9 have, though not shown in the drawing, a conductor pattern and electronic parts 7, respectively.

If, for example, a power transistor, a rectifier diode, or any other electronic part which generate heat in large quantity is mounted on the insulation layer 8, a material having a high thermal conductivity must be used as the insulation layer 8 to prevent the electronic part from being over heated.

If, for instance, an electronic part which undergoes a high speed switching operation is mounted on the insulation layer 9, a material having a low dielectric constant must be used as the insulation layer 9 to lower crosstalk in the electronic circuit and to reduce the influence to other circuits even at the generation of a switching noise.

In this embodiment, the insulation layer constituting the board is divided into a plurality of sections, and each of the divided insulation layers is made of a material having the optimal physical properties for the electronic part to be mounted thereon according to the characteristics and the operational conditions of the parts. In this manner, the parts can be mounted without influencing each other even in case of increasing the mount density. Thus, the circuit operation can be kept in normal condition while increasing the mount density of the parts.

In the previous embodiment, the insulation layers 8 and 9 were provided by dividing the metallic printed board 11 into two sections. However, the insulation layer can be divided into larger number of sections to use a plurality of insulation layers each differing in characteristics. Furthermore, a double-sided printed board 4 laminated over the metallic printed board 11 can be divided into a plurality of sections to provide insulation layers each differing in physical properties.

Figure 3:
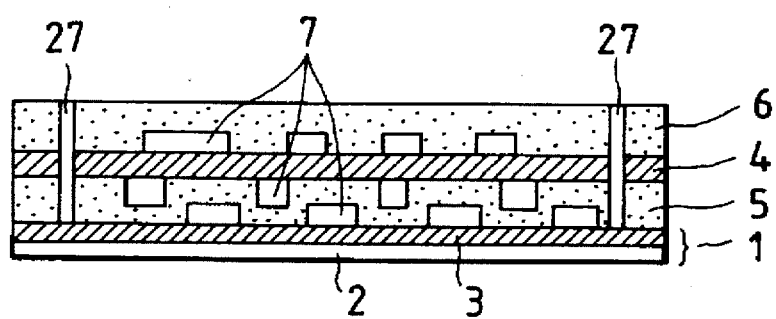
FIG. 3 is a cross sectional view showing a multilayered metallic printed board according to a third embodiment of the present invention.

FIG. 3 is a cross sectional view showing a multilayered metallic printed board according to a third embodiment of the present invention.

This embodiment is essentially the same as that illustrated in FIG. 1, except for a part of the double-sided printed board 4 and the insulation resins 5 and 6 shown in FIG. 1. The other parts are the same as those in FIG. 1, and are therefore indicated with the same symbols to make reference thereto without any explanation.

FIG. 3 shows a state in which there is a need to connect conductor patterns, not shown in the drawing, of the respective metallic printed board i and the double-sided printed board 4. In this state, a through hole 27 penetrating an insulation resin layer 6, the double-sided printed board 4, and another insulation layer 5 is formed to connect the conductor patterns. The circuits on both of the laminated boards 1 and 4 can be easily connected with each other by using the through hole 27.

The embodiment is also applicable to the foregoing first and second embodiments.

Figure 4A:
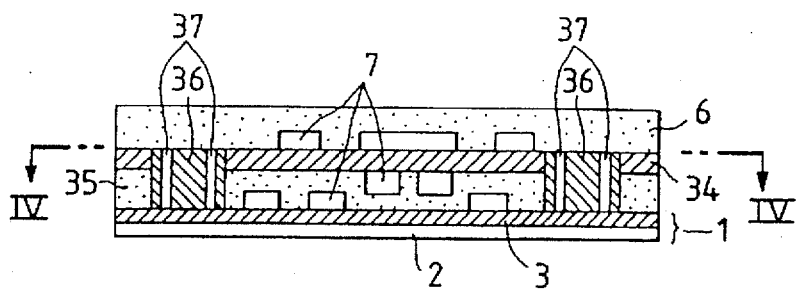
FIG. 4(a) is a cross sectional view showing a multilayered metallic printed board according to a fourth embodiment of the present invention.
Figure 4B:
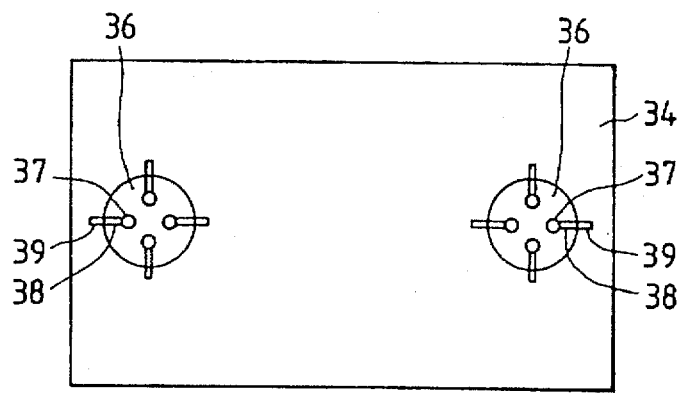
FIG. 4(b) is a view taken along the arrow in FIG. 4(a)

FIGS. 4(a) and 4(b) are cross sectional views showing a multilayered metallic printed board according to a fourth embodiment of the present invention, wherein FIG. 4(a) is a cross sectional view and FIG. 4(b) is a view taken along line A—A in FIG. 4(a).

This embodiment is obtained by partly changing the double-sided printed board 4 and the insulation layer 5 in FIG. 1. The other portions are in common with those shown in FIG. 1. Accordingly, the common portions are indicated with the same symbols used in FIG. 1 to refer thereto without giving any explanation.

In FIGS. 4(a) and 4(b), when there is a need that conductor patterns, not shown in the drawing, of a metallic printed board 1 and a double-sided printed board 34 are to be connected with each other, the portion in the board 34 corresponding to the position of connection is cut out to fit and fix therein a through-hole substrate 36 shaped in the same shape as that of the cut-out portion. The substrate 36 has such a thickness that the lower end thereof is in contact with the board 1 when laminated, and a through hole 37 is formed therein along the thickness direction of the substrate.

Similarly, an electrode pattern 39 to be connected with the end of the outer periphery of an electrode pattern 38 is formed on the metallic printed board 1 to be brought into contact with the end of the outer periphery of the electrode pattern 38, and on the upper surface of the double-sided printed board 34. Thus, in the assembly, the board 34 having the through hole substrate 36 fitted therein is mounted on the board 1, and the electrode pattern 38 is connected by soldering with the electrode pattern 39 formed on the upper surfaces of each of the boards 1 and 34. Then, the boards 1 and 34 are fixed by filling the space between the boards with an insulation resin 35, and by curing the thus filled insulation resin. An insulation resin 6 is laminated on the upper surface of the board 34 and cured in the same manner.

In this embodiment, the space between the metallic printed board 1 and the double-sided printed board 34 is supported by the through-hole substrate 36, and the electrode patterns 38 and 39 are soldered to attain mechanical stability between both of the laminated boards 1 and 34. Similarly, the electrode patterns 38 and 39 are electrically connected to facilitate the circuit connection between the boards 1 and 34.

Three or more through-hole substrates 36 can be incorporated in the structure. Furthermore, the shape and the size of the through-hole substrate 36 can be varied depending on the electronic parts 7 to be mounted, and on the constitution of the circuit.

The present embodiment is also applicable to any of the foregoing firsts second, and third embodiments.

Figure 5:
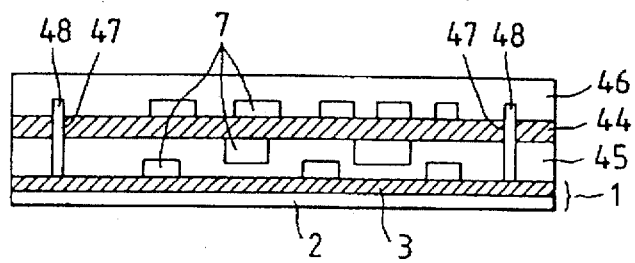
FIG. 5 is a cross sectional view showing a multilayered metallic printed board according to a fifth embodiment of the present invention.

FIG. 5 is a cross sectional view showing a multilayered metallic printed board according to a fifth embodiment of the present invention.

This embodiment is essentially the same as that illustrated in FIG. 1, except for a part of the double-sided printed board 4 and the insulation resins 5 and 6 shown in FIG. 1. Accordingly, the common parts are indicated with the same symbols as in FIG. 1 to make reference thereto without any explanation.

In FIG. 5, when conductor patterns, not shown in the drawing, of a metallic printed board 1 and a double-sided printed board 44 are to be connected with each other, a through hole 47 is formed in the portion corresponding to the connection of the board 44, a metallic pin 48 is inserted into the through hole, and the pin is fixed to the conductor pattern on the board 44 by soldering.

Then, the board 44 to which the metallic pin 48 is fixed is mounted on the metallic printed board 1 to solder the electrode pattern, not shown in the drawing but provided on the upper surface of the board 1, with the lower end of the metallic pin 48. Subsequently, the space between both the boards 1 and 44 is filled with an insulation resin 45, and the resin is cured to fix the boards. Similarly, an insulation resin 46 is laminated on the upper surface of the double-sided printed board 44 and allowed to cure.

In this embodiment, the upper and the lower ends, i.e., the metallic printed board 1 and the double-sided printed board 44 are supported by the metallic pin 48, and, at the same timer the conductor patterns on each of the boards 1 and 44 are soldered together with the metallic pin 48 to mechanically stabilize both of the laminated boards. Furthermore, the connection between the circuits provided on both of the boards can be easily implemented since the conductor patterns provided on each of the boards are electrically connected.

This embodiment is also applicable to the first to the fourth embodiments described above.

Figure 6:
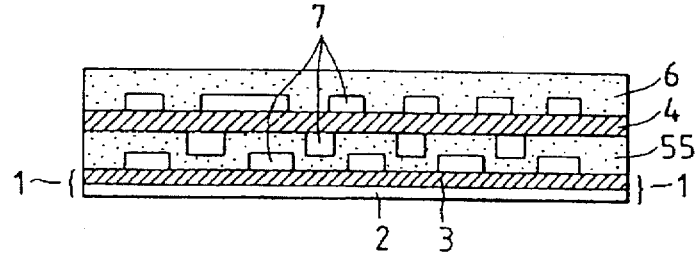
FIG. 6 is a cross sectional view showing a multilayered metallic printed board according to a sixth embodiment of the present invention.

FIG. 6 is a cross sectional view showing a multilayered metallic printed board according to a sixth embodiment of the present invention.

This embodiment is essentially the same as that illustrated in FIG. 1, except for the insulation resin 5 shown in FIG. 1. Accordingly, the common parts are indicated with the same symbols as in FIG. 1 to make reference thereto without explanation.

In this embodiment, a prepreg 55 is incorporated between the metallic printed board 1 and the double-sided printed board 4 as shown in the drawing. That is, a monolithic structure is obtained at the assembly step by compressing the boards 1 and 4 together with the prepreg 55 incorporated therebetween. In this case, a strong and air-tight structure is obtained by compressing the boards 1 and 4 using a vacuum press.

This embodiment is also applicable to the first to the fifth embodiment described above.

In case a vacuum press is unapplicable to the process according to the sixth embodiment due to the characteristics of the electronic parts 7 to be mounted, monolithic molding can be effected by injecting an insulation resin inside a shaping mold in which a plurality of boards having the parts mounted thereon are already set. Also in this case, an air-tight resin portion can be realized while increasing the strength of the entire module.

Figure 7:
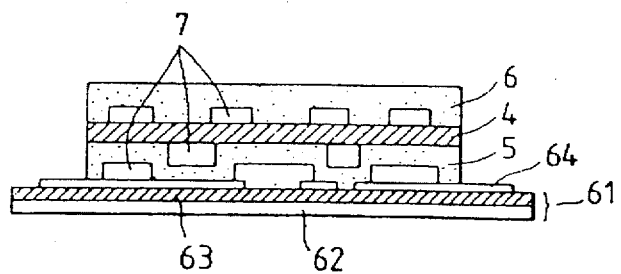
FIG. 7 is a cross sectional view showing a multilayered metallic printed board according to a seventh embodiment of the present invention.

FIG. 7 is a cross sectional view showing a multilayered metallic printed board according to a seventh embodiment of the present invention.

This embodiment is characterized in a metallic printed board, and the other parts are essentially the same as those illustrated in FIG. 1. Accordingly, the common parts are indicated with the same symbols as in FIG. 1 to make reference thereto without giving any explanation.

In FIG. 7, a metallic printed board 61 is composed of a metallic sheet 62 as a base, an insulation layer 63, and a conductor pattern 64 provided on the upper surface of the insulation layer 63.

This embodiment is characterized by the metallic printed board 61 which is formed larger than the double-sided printed board 4 and the insulation resins 5 and 6 that are formed on the metallic printed board 61. In this manner, the conductor pattern 64 on the outer periphery portions can be exposed to use them as a portion for interconnecting the entire conductor pattern 64 with an external circuit.

By thus exposing the conductor pattern 64 of the metallic printed board 61, a more facile operation can be realized in connecting the board with an external circuit.

This embodiment is also applicable to any of the foregoing embodiments, i.e., the first to the sixth embodiments.

Figure 8:
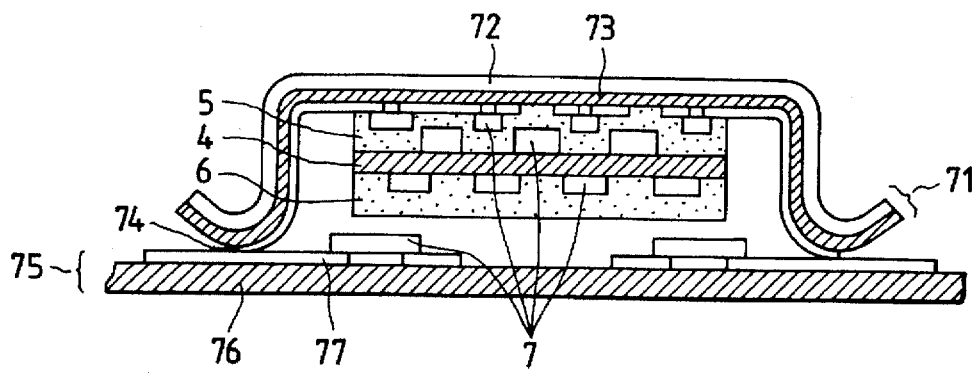
FIG. 8 is a cross sectional view showing a multilayered metallic printed board according to an eighth embodiment of the present invention.

FIG. 8 is a cross sectional view showing a multilayered metallic printed board according to an eighth embodiment of the present invention.

This embodiment is an advanced form of the board according to the seventh embodiment illustrated in FIG. 7.

More specifically, a metallic printed board 71 still larger than that shown in FIG. 7, is composed of a metallic sheet 72 as a base, an insulation layer 73, and a conductor pattern 74 provided on the upper surface of the insulation layer 73. The outer peripheral portion of the board 71 is bent upward making approximately a right angle with respect to the board, and the edge portion of the bent portion is further folded mildly downward along an oblique direction.

A mother board 75 is mounted on the conductor pattern 74 provided on the uppermost portion of the folded portion of the metallic printed board 71 in such a manner that the mother board may cover the conductor pattern from the upper side. A conductor pattern 77 formed on the lower side of the mother board is connected with the conductor pattern 74 of the board 71 by soldering. An insulation layer 76 is provided for the mother board 75 as shown in the drawing.

In the manner described in the foregoing, a casing can be established by folding the outer peripheral portion of the metallic printed board 71 upward and further covering the thus formed structure with the mother board 75 from the upper side. Thus, the circuit of the electronic parts 7 mounted inside the casing can be shielded and protected from the outside.

This embodiment is also applicable to any of the foregoing embodiments, i.e., the first to the sixth embodiments.

Figure 9:
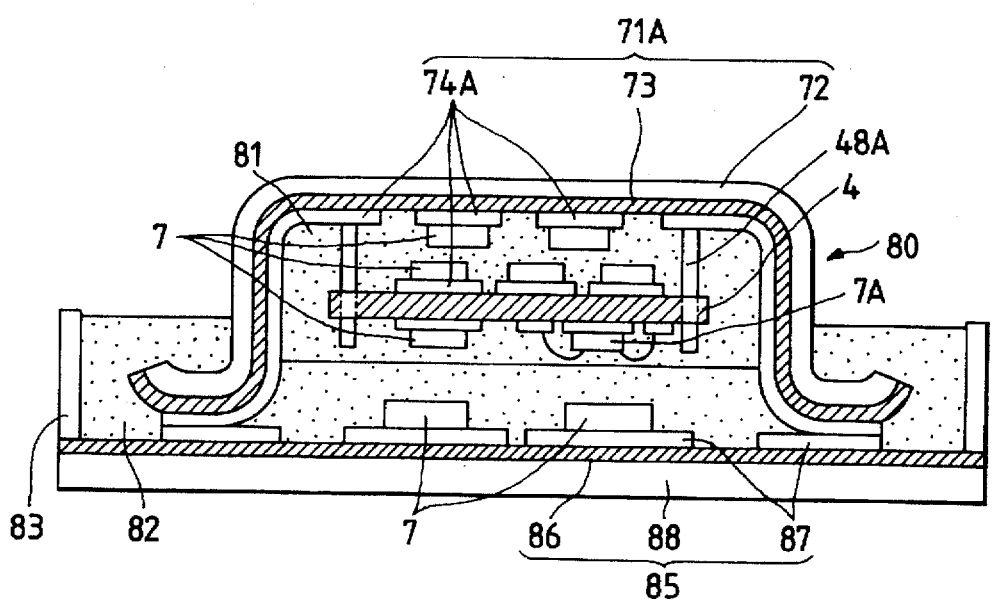
FIG. 9 is a cross sectional view showing a molded module according to a ninth embodiment of the present invention.

FIG. 9 is a cross sectional view showing a molded module comprising a multilayered package and a mother board, according to a ninth embodiment of the present invention. This embodiment is an advanced form of the eighth embodiment illustrated in FIG. 8.

In FIG. 9, more specifically, a metallic printed board 85 which becomes a mother board after mounting the electronic parts, comprises a metallic sheet 88 as a base, an insulation layer 86, and a copper foil 87 of the conductor pattern. The electronic parts 7 are mounted on the upper surface of the copper foil 87. The parts other than an IC bare chip 7A, such as resistors and capacitors, are referred to hereinafter as electronic parts.

Aluminum, copper, iron, etc., are used as the metallic sheet 88. The metallic sheet is provided at a thickness approximately in a range of from 1 to 3 mm. Suitable materials for the insulation layer 86 include an epoxy resin comprising inorganic fillers of alumina, quartz and the like, and glass mat, glass non-woven material, non-woven polyamide and the like being impregnated with an epoxy resin. The thickness of the insulation layer is approximately in a range of from 0.05 to 0.5 mm.

A multilayered package 80 comprising a plurality of layers of electronic parts therein is disposed over the board 85. A folded metallic printed board 71A comprises a metallic sheet 72 as a base, which is made of aluminum, copper, iron or the like. The metallic sheet is preferably provided at a thickness approximately in the range of from 0.2 to 1 mm to make the sheet suitable for bending process. However, the thickness range is not limited thereto because the thickness can be selected according to the radius of curvature in bending.

The insulation layer 73 to be provided on the inner side of the metallic sheet 72 is preferably made of a flexible material such as polyimide, polyether ether ketone, and aramid, so that it may not be damaged due to bending. The thickness of the insulation layer 73 is approximately in the range of from 0.02 to 0.4 mm.

The metallic sheet 88 of the metallic board 85 and the metallic sheet 72 of the metallic board 71A are made of the same material to set the thermal expansion coefficients of both to the same value. For instance, if copper is used as the metallic sheet 88, the metallic sheet 72 must be also made of copper. If aluminum is the material of the metallic sheet the metallic sheet 72 is also made of aluminum. In case a material having a thermal expansion coefficient other than those of copper and aluminum is used, the same material must be used in both the metal sheets 88 and 72 to maintain the thermal expansion coefficient equal in both sheets.

If a glass epoxy printed board or any printed board other than the metallic printed board is used as the mother board, the material for the printed board must be such having a thermal expansion coefficient equal to or nearly equal to that of the metallic sheet 72.

A copper foil 74A of the conductor pattern is formed on the inner surface of the insulation layer 73 of the printed board 71A. An electrolytic copper foil, a rolled copper foil, or the like is suitable for use as the copper foil 74A and the copper foil 87 of the board 85, and the copper foils preferably have a thickness of from 1 to 200 μm. In particular, the copper foil for use as the copper foil 87 preferably has a thickness of from 35 to 200 μm, and that for use as the copper foil 74A preferably has a thickness of from 5 to 70 μm.

The multilayered package 80 comprises electronic parts 7 which are mounted on the printed board 71A itself, one or more double-sided printed boards 4 which are located on the lower side of the drawing, and electronic parts 7 and IC bare chip 7A which are mounted on the printed board 4.

The connector pin (metallic pin) 48A mechanically supports the printed board 4, and connects the electronic parts 7 and IC bare chip 7A mounted on both the surfaces of the printed board 4 with the electronic parts 7 mounted on the printed boards 71A and 85 via the copper foils 74A and 87 provided as the conductor patterns on the printed boards 71A and 85.

The connector pin 48A is connected previously to the copper foil 74A of the printed board 71A by soldering, and the printed board 4 mounted thereon the electronic parts 7 and the like is connected and fixed to the connector pin 48A by soldering.

As described in the foregoing, the multilayered package 80 includes therein the laminates of printed boards or electronic parts, They are not necessarily limited to the two-layered structure as shown in the drawing, but the printed boards 4 can be added to further increase the number of the layers.

The IC bare chip 7A undergoes a high speed switching operation, and is mounted on the printed board 4 by wire bonding or bump process. The bare chip 7A is generally sealed with a chip coating material such as epoxy resin to protect the chip after mounting.

In general, the IC bare chip 7A undergoes a high speed switching operation, and is therefore apt to malfunction due to the crosstalk inside the electronic circuit and to the external noises. Thus, the bare chip is preferably mounted indirectly on the printed boards 71A and 85, because they have a large dielectric constant and they therefore tend to catch noises. Thus, the bare chip is mounted on the printed board 4 which is finally sealed with an insulation resin. As a matter of course, the bare chip may be mounted on an already laminated double-sided printed board.

The inside of the multilayered package 80 is filled with a highly thermo-conductive insulation resin 81. An epoxy resin containing inorganic fillers of alumina, quartz or the like is used for the insulation resin 81. The thermal expansion coefficient of the insulation resin must be selected to be a value equal to or nearly equal to that of the metallic sheet 72 as the outer frame of the package 80. For instance, if copper is used as the metallic sheet 72, an insulation resin having a thermal expansion equal to that of copper is preferably used. Specifically, a resin having a thermal expansion coefficient at least in the range of from $15 \times 10^{-6}$ $C.^{-1}$ to $17 \times 10^{-6}$ $C.^{-1}$ is selected. A resin having a thermal expansion coefficient as near as possible to the value of copper, i.e., $16 \times 10^{-6}$ $C.^{-1}$, is more preferably used. The thermal expansion coefficient of the entire metallic printed board 71A falls at a value nearly equal to that of the metallic sheet 72.

By thus setting the thermal expansion coefficient of the insulation resin 81 approximately equal to that of the metallic sheet 72 of the package 80, the thermal stress which is applied to the entire module by the heat generated from the electronic parts 7 and the IC bare chip 7A can be lowered. In this manner, the peeling off at the boundary between the metallic printed board 71A and the insulation resin 81, or the disconnection of the copper foil 74A on the board 71A can be prevented from occurring.

When aluminum is used for the metallic sheet, an insulation resin 81 having the same thermal expansion coefficient as that of aluminum, i.e., $27 \times 10^{-6}$ $C.^{-1}$, is preferably used to fill the inside of the package. The thermal expansion coefficient of the resin must be set at least in the range of from $26 \times 10^{-6}$ $C.^{-1}$ to $28 \times 10^{-6}$ $C.^{-1}$, and preferably, at a value as near as possible to $27 \times 10^{-6}$ $C.^{-1}$.

In case a metallic sheet 72 made of a material other than copper or aluminum is used, the use of an insulation resin 81 having a thermal expansion coefficient matched with that of the metallic sheet 72 is required.

The insulation resin 81 is injected into the package under a normal pressure or under a reduced pressure in the range of from 650 to 760 Torr. Preferably, the resin is incorporated under a pressure in the range of from 700 to 760 Torr to prevent voids from remaining between the laminated printed boards.

A highly thermally conductive insulation resin 82 is used, after the printed board 85 as the mother board is jointed to the package 80 by soldering, for resin-molding the periphery of the solder joint portions and the entire space defined between the printed board 85 and the insulation resin 81 inside the package 80.

The insulation resin 82 is made of the same material as the insulation resin 81. Accordingly, the thermal expansion coefficient is the same for both. Thus, the thermal strain can be reduced in case a thermal stress is applied to the module, and the boundary between the insulation resins 81 and 82 can be tightly fixed to prevent peeling off from occurring on the boundary. Furthermore, the copper foil 74A can be prevented from suffering disconnection or damage due to the deformation of the printed boards 71A and 4.

The insulation resin 82 is injected into the package under a normal pressure or under a reduced pressure in the range of from 650 to 760 Torr in a manner similar to that employed for the insulation resin 81. Preferably, the resin is incorporated under a pressure in the range of from 700 to 760 Torr to prevent voids from remaining at a portion adjoining the insulation resin 81 and to effectively discharge the generated heat.

Furthermore, the entire periphery inclusive of the space between the printed board 85 and the package 80 is sealed with an insulation resin 82, in order to protect the copper foil 87 and the copper foil 74A in the vicinity of the joint portion against the external moisture and dust, and to prevent defective connection from occurring due to short circuit and deterioration of the foils. Furthermore, the joint portion between the printed board 85 and the package 80 is sealed with the insulation resin 82 to assure the establishment of a tight mechanical joint and electric connection between the board and the package. A frame 83 for filling the resin is also shown in the drawing.

Figure 10A:
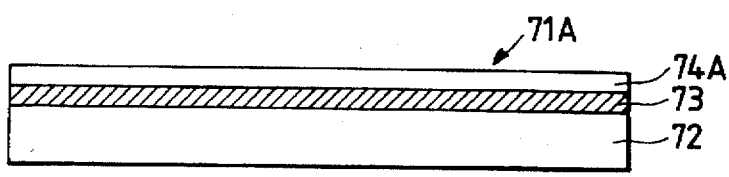
FIGS. 10(a) and 10(b) are cross sectional views showing a metallic printed board used in a tenth embodiment of the present invention, respectively.
Figure 10B:
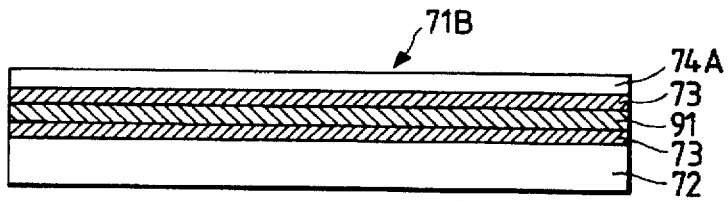

FIGS. 10(a) and 10(b) are views of a tenth embodiment of the present invention, wherein FIG. 10(a) is a cross sectional view of a metallic printed board 71A for a multilayered packager and FIG. 10(b) is a cross sectional view of a metallic printed board 71B for use similarly as in the foregoing but with the addition of an insulation sheet to the metallic printed board 71A.

Referring first to FIG. 10(a), the metallic printed board 71A comprises an insulation layer 73 made of a thermosetting polyimide adhesive sheet, e.g., a polyimide bonding sheet SPB series produced by Nippon Steel Corporation. The use of this particular sheet allows the copper foil 74A of the conductor pattern to be easily adhered with a metallic sheet 72 by using a vacuum heating press and the like.

Referring to FIG. 10(b), the insulation layer 73 is 5 formed on each of the copper foil 74A and the metallic sheet 72, and an insulation sheet 91 is incorporated between the insulation layers 73 to establish the printed board 71B.

The insulation sheet 91 is a sheet or a film made of polyimide, polyester, aramid, polyphenylene sulfide, polyether ether ketone, etc. By thus laminating the insulation layer 73 on two layers by incorporating the insulation sheet 91 therebetween, an insulation layer having a desired thickness and electric and physical characteristics can be implemented.

FIGS. 11(a) to 11(e) are views of an eleventh embodiment of the present invention, and show steps of producing a multilayered package 80 in sequence.

Figure 11A:
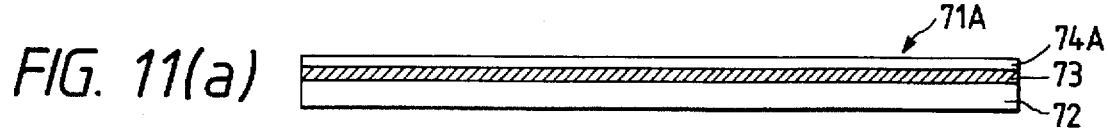
FIGS. 11(a) to 11(e) are cross sectional views showing steps of producing a multilayered package used in an eleventh embodiment of the present invention.

First, FIG. 11(a) is a cross sectional view showing the metallic printed board 71A for the multilayered package shown in the FIG. 10(a).

Figure 11B:
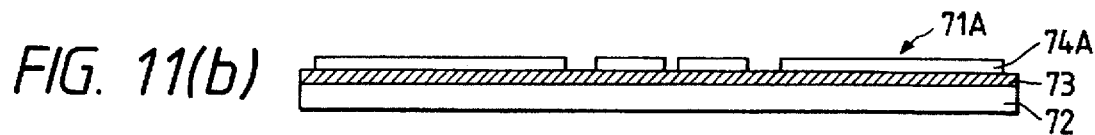

FIG. 11(b) is a cross sectional view showing the metallic printed board 71A obtained after forming a conductor pattern by etching the copper foil 74A.

Figure 11C:
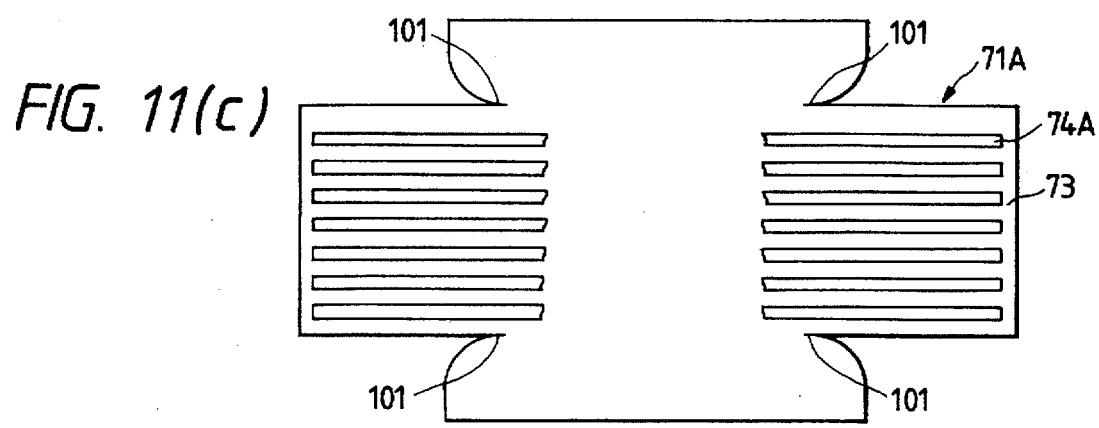

FIG. 11(c) is a plan view showing the punched out metallic printed board 71A obtained by pressing after the etching step, so that the structure thus obtained is finally processed into a box-shaped package, In FIG. 11(c), the four sides which become side walls of the package 80 by a subsequent bending process, comprises two side planes (the portions shown in the right and left sides of the drawing) on which the copper foil 74A is processed and formed to connect the package with the metallic printed board 85 for the mother board, and two other side planes (the portions shown in the upper and lower sides of the drawing) having no copper foil 74A thereon.

In the four sides above, the two side planes having thereon the copper foil 74A are bent with a radius of curvature in the range of from 1 to 5 mm so that the insulation layer 73 may not be damaged. Furthermore, slits 101 are provided on the corner portions of the other two side planes having no copper foils 74A thereon at the same radius of curvature as that of the bent of the two side planes having the copper foil, so that the gap at the corner might be minimized when the two side planes are butted with the other two side planes having thereon the copper foils 74A.

The two side planes having no copper foil 74A thereon are bent at an acute angle to minimize the gap and to obtain a deep package when the punched printed board is shaped into a package.

Figure 11D:
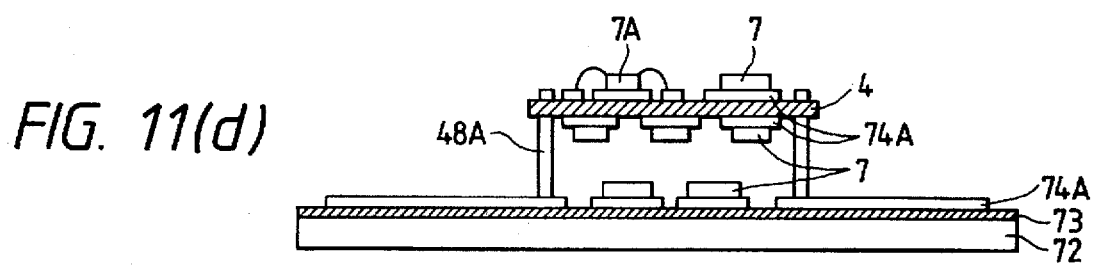

FIG. 11(d) is a cross sectional view showing a structure which is obtained by mounting electronic parts 7 and a connector pin 48A on the punched out printed board 71A, which is subjected to pressing and is shown in FIG. 11 (c), and then fixing a double-sided printed board 4 already having the electronic parts 7 and IC bare chip 7A to the upper side thereof.

Figure 11E:
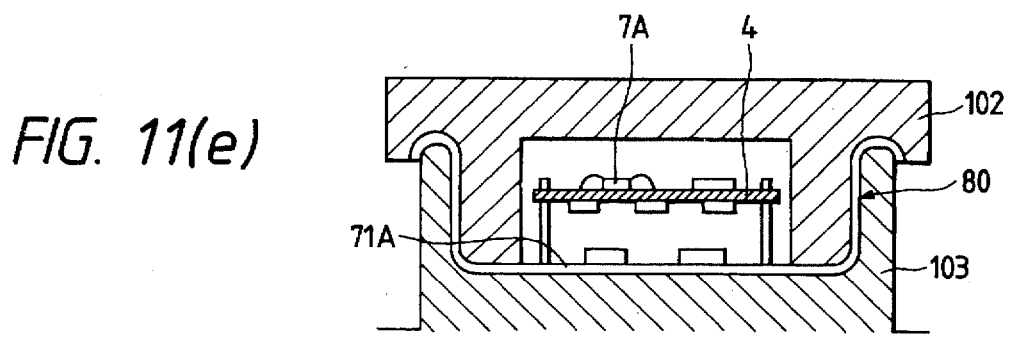

FIG. 11(e) is a cross sectional view showing a structure obtained by folding the structure shown in FIG. 11(d) into a package structure using a press. An upper mold 102 and a lower mold 103 both used in the folding process are also shown in the drawing. As a matter of convenience, the details in the printed board 71A, such as the metallic sheet 72, the insulation layer 73, and the copper foil 74A, are not shown individually in FIG. 11(e).

The mold 102 referred above has a hollow structure in which the portion corresponding to the laminate of the printed boards 4 and 71A is bored, so that the printed board 71A can be folded without damaging the electronic parts 7 and the like mounted on the printed boards 4 and 71A.

Furthermore, the foregoing molds 102 and 103 have the portions on the outer periphery facing to each other being curved at a predetermined radius of curvature to provide a joint portion with the metallic printed board 85 of the mother board by curling only the edge portions of the two side planes having thereon the copper foil 74A of the board 71A. Although not shown in the drawing, the two molds 102 and 103 are shaped such that the two side planes having no copper foil 74A of the board 71A thereon may be bent making an acute angle with a radius of curvature of 1 mm or less.

Thus, the multilayered package including multiple layers of electronic parts or printed boards can be obtained by the steps of FIGS. 11(a) to 11(e), and the multilayered package 80 is formed by injecting the insulation resin 81 into the package thus obtained.

If the structure of the molds for folding is changed, the multilayered package with the printed board 71A having a desired depth of side plane and a desired shape, radius of curvature, etc., of the curled portion can be implemented.

Figure 12A:
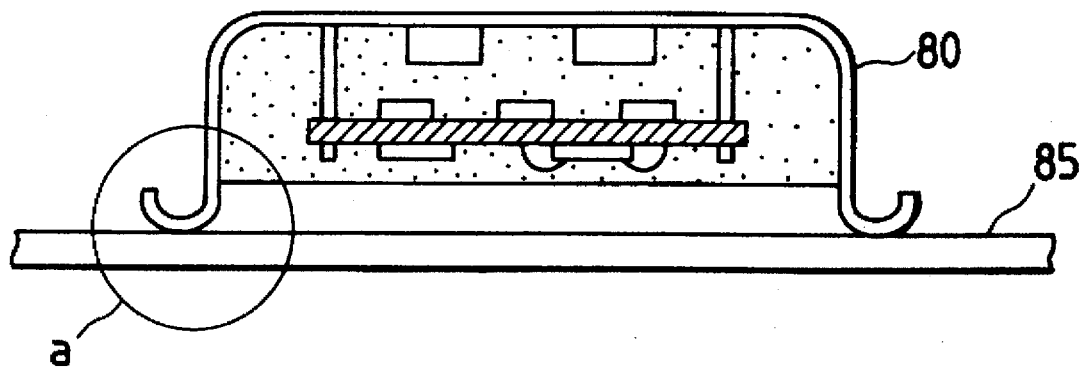
FIGS. 12(a) and 12(b) are cross sectional views showing a twelfth embodiment of the present invention.
Figure 12B:
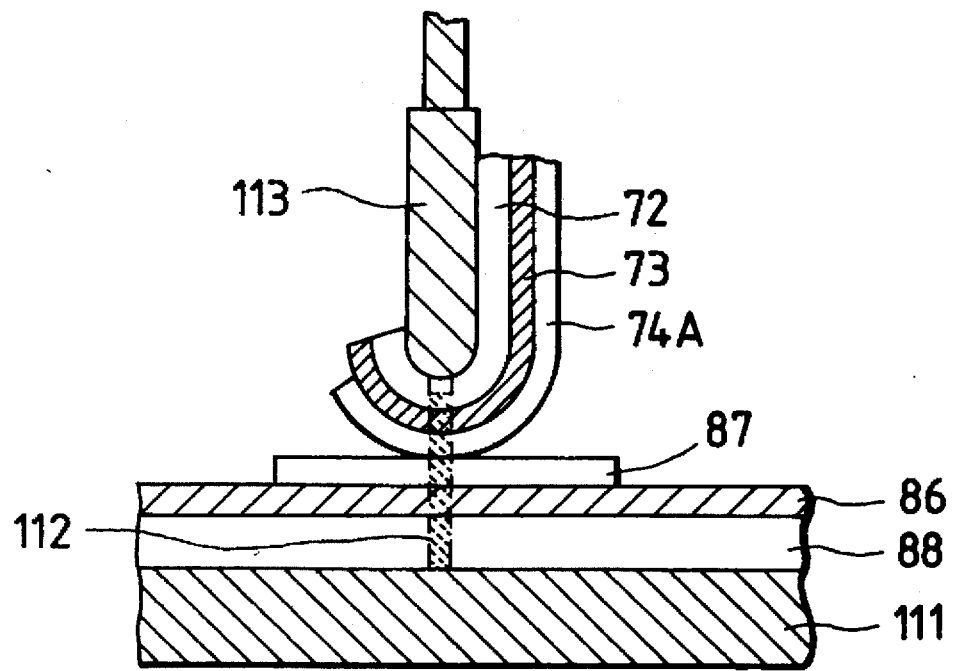

FIGS. 12(a) and 12(b) are views of a twelfth embodiment of the present invention.

FIG. 12(a) is a cross sectional view showing the entire structure obtained by solder joining the multilayered package 80 with a metallic printed board 85. As a matter of convenience, the metallic sheet 72, the insulation layer 73, the copper foil 74A etc. of the printed board 71A which constitutes the package 80 are not shown individually in FIG. 12(a).

In FIG. 12(b), an alignment jig 111 is provided for precisely aligning the package 80 with the printed board 85.

The jig 111 comprises a pin 112. The package 80 can be aligned with the printed board 85 in a horizontal plane by inserting the pin 112 into a penetration hole provided in the connecting portion (joint portion) of the package 80 and in the connecting portion (joint portion) of the printed board 85. As a matter of courser the penetration holes are bored in portions other than the copper foils 87 and 74A, so the mutual electric connection between the two copper foils is not impaired.

After aligning the package 80 with the printed board 85 using the pin 112, (the tip of) a solder iron 113 is pressed against the curled portion on the lower end of the two sides of the package 80 to fuse the solder cream previously applied to both the copper foils 87 and 74A. The copper foils are connected with each other in this manner. The shape and the structure of the tip of the solder iron 113 are provided as such corresponding to the curled portion to increase the efficiency of heat conduction. Moreover, if the solder iron 113 is used, an already joined package 80 can be easily detached.

The shape of the tip of the solder iron 113 is not necessarily matched to that of the curled shape, but it may be shaped in accordance with the shape and the structure of the joint portion of the package 80.

In FIGS. 11(a) to 11(e) and 12(a) to 12(b), the metallic printed board 71A shown in FIG. 10(a) is used as the multilayered package 80. However, it is also possible to use the metallic printed board 71B shown in FIG. 10(b) in the place of the metallic printed board 71A.

As described in the foregoing, the present invention provides the following effects:

According to the first aspect of the present invention, one or more printed boards are laminated over a metallic printed board formed of a metallic sheet as a base via an insulation resin. Thus, the mount density can be Considerably increased by allowing electronic parts to be mounted on a plurality of layers.

According to the second aspect of the present invention, a resin having a high thermal conductivity is used as the insulation resin for lamination. Accordingly, a higher mount density can be achieved because the heat generated by the mounted parts can be efficiently discharged.

According to the third aspect of the present invention, the insulation layer is divided into a plurality of portions, and the portions are made of materials differing from each other in physical properties. The materials can be selected according to the operation characteristics of the mount circuits, for example, an insulator having a high thermal conductivity or an insulator having a low dielectric constant is selected. As a result, a stable circuit operation can be realized to further increase the mount density.

According to the fourth aspect of the present invention, a through hole penetrating the conductor patterns is formed through the laminated boards. Thus, a connection of the conductor patterns on the boards can be realized more easily, thereby improving the operability in connecting the circuits.

According to the fifth aspect of the present invention, a part of the printed board laminated over the metallic printed board is cut out, and a substrate having thereon a through hole and an electrode pattern for connection is fitted and buried into the cut-out portion of the printed board. Thus, the operability in connecting the circuits can be improved because the electrode pattern can be more easily connected with the conductor patterns on other printed boards.

According to the sixth aspect of the present invention, a metallic pin is buried in the thickness direction, which is used to connect the conductor patterns formed on the printed boards facing to each other. Thus, the operability in connecting the circuits can be improved because connection between the conductor patterns on the printed boards becomes easy.

According to the seventh aspect of the present invention, a multilayered metallic printed board is improved in an air-tightness and in strength, because the entire body is obtained by incorporating an insulation resin between the printed boards as prepregs and performing the monolithic molding using a vacuum pump.

According to the eighth aspect of the present invention, a multilayered metallic printed board is improved in air-tightness and strength, because a plurality of boards having thereon the mounted parts are set inside a shaping mold and are molded monolithically by injecting an insulation resin into the mold.

According to the ninth aspect of the present invention, the metallic printed board larger than the outer periphery of the printed board and the insulation resin layer formed thereover is formed, and the conductor pattern formed on the surface of the metallic printed board is exposed to form a portion for the connection with an external circuit. Thus, the operability in the connection with an external circuit can be improved in this manner.

According to the tenth aspect of the present invention, the edge portion of the metallic printed board is bent upward to form a casing covering the printed board portion laminated over the board. Thus, the circuit of the mounted parts on the boards can be protected and shielded from the outside.

According to the eleventh aspect of the present invention, the electronic parts are mounted on multiple layers including a printed board as a mother board, a metallic printed board of a multilayered type package joined to the mother board by means of soldering and the like, and printed boards inside the multilayered package. Thus, the mount density can be considerably increased. At the same time, parts differing in shape can be mounted by taking the spacing of the lamination between each of the printed boards into consideration.

Furthermore, the heat generated from the parts can be allowed to diffuse efficiently via the insulation resin, metallic printed boards, and the like, and the parts can be protected against external moisture and various types of atmospheres to prevent deterioration, by sealing each of the parts with an insulation resin and by bringing the insulation resin at the package side into close contact with the insulation resin at the metallic printed board side for the mother board. Furthermore, the mechanical strength and the electric reliability of the module can be improved by assuring a tight integration of the package with the metallic board as the mother board using the insulation resin.

According to the twelfth aspect of the present invention, a metallic sheet is fixed to a copper foil for the conductor pattern with an insulation layer being incorporated therebetween. Thus, a flexible metallic printed board for a multilayered package can be fabricated easily, and the operability in bending work can be improved.

According to the thirteenth aspect of the present invention, IC bare chips for high speed switching are mounted on the printed board other than the metallic printed board inside the multilayered package, and then the chips are molded with an insulation resin. Thus, a stable circuit function can be obtained without being influenced by crosstalk and external noises.

According to the fourteenth aspect of the present invention, a deep multilayered package formed approximately in the shape of a box and having substantially no space in the corners can be obtained. Thus, the module is more suitable for accommodating electronic parts in multiple layers to achieve high mount density.

According to the fifteenth aspect of the present invention, copper foils formed on two side planes having a larger radius of curvature are used for connection with the printed board as the mother board. Thus, a highly reliable multilayered package can be obtained free from the disconnection of copper foil and destruction of the insulation layer.

According to the sixteenth aspect of the present invention, the metallic printed board alone can be bent and worked without causing damage on the printed boards and mounted parts inside the multilayered package, and on the mounted parts on the printed board as the mother board.

According to the seventeenth aspect of the present invention, a reliable module can be obtained in which the heat from the parts are effectively discharged, and disconnection and the like due to deformation, etc., attributed to thermal stress is prevented by making the thermal expansion coefficient of the metallic sheet of the multilayered package equal to that of the highly thermo-conductive insulation resin.

According to the eighteenth aspect of the present invention, the joining edge of the multilayered package and that of the printed board as the mother board can be accurately aligned in the horizontal direction. Thus, this increases the dimensional precision of the joining position.

According to the nineteenth aspect of the present invention, a solder iron having an iron tip shape corresponding to the joining edge of the multilayered package is used. Thus, the operation of joining or detaching the package can be effected easily and rapidly.

According to the twentieth aspect of the present invention, as the mother board, a printed board having a thermal expansion coefficient equal to or nearly equal to that of the metallic printed board of the multilayered package is used. Thus, the cracks can be prevented from occurring on the solder at the joint portion between both the boards, and hence a module improved in mechanical strength and in electric reliability can be implemented.

According to the twenty-first aspect of the present invention, the peripheral portion of the joint between the two printed boards and the portion between the printed board as the mother board and the multilayered portion are filled with a highly thermally conductive insulation resin having a thermal expansion coefficient nearly equal to that of the insulation resin of the package. Thus, the adhesiveness between the resins can be improved, and deformation or damage attributed to thermal stress can be prevented to realize a module improved in mechanical strength and in electric reliability.

What is claimed is:

1. A multilayered printed board structure, comprising:
   an insulated metal substrate including an insulating layer laminated on a metallic plate as a base layer and a conductive layer on said insulating layer, and having first electronic components mounted on said insulated metal substrate;

at least one printed board laminated over a first side of said insulated metal substrate on which said first electronic components are mounted, and having second electronic components mounted on one or both sides of said printed board;

an insulating resin filling a space between said insulated metal substrate and said printed board;

said printed board or said insulation layer of said insulated metal substrate being divided into at least first and second portions, said first portion containing electronic parts similar in first operational characteristics; and said second portion containing parts similar in second operation characteristics, said first and second operational characteristics being different; and said portions of said printed board or said insulating layer formed of materials differing in physical properties and selected in relation to the operational characteristics of said electronic parts of said portion.

2. A multilayered printed board structure as claimed in claim 1, wherein said insulation resin has a high thermal conductivity.

3. A multilayered printed board structure as claimed in claim 1, wherein a through hole is formed in said at least one printed board to penetrate a conductor pattern provided on said at least one printed board.

4. A multilayered printed board structure as claimed in claim 1, further comprising a metallic pin for connecting conductor patterns provided on said boards facing to each other, said pin being buried along the thickness direction of said multilayered printed board structure.

5. A multilayered printed board structure as claimed in claim 1, wherein said multilayered printed board structure has a monolithic structure formed by applying a vacuum press to said boards and said insulation resin incorporated as prepregs between each of said boards.

6. A multilayered printed board structure as claimed in claim 1, wherein said multilayered printed board structure has a monolithic structure formed by injecting said insulation resin into a shaping mold after placing therein said at least one printed board having said mounted electronic components.

7. A multilayered printed board structure as claimed in claim 1, wherein said insulated metal substrate is larger than an outer periphery of said at least one printed board and said insulation resin over said insulated metal substrate, and a conductor pattern formed on a surface of said insulated metal substrate is exposed to form a connecting portion with an external circuit.

8. A multilayered printed board structure, comprising:

an insulated metal substrate including an insulating layer laminated on a metallic plate as a base layer and a conductive layer on said insulating layer, and having first electronic components mounted on said insulated metal substrate;

at least one printed board laminated over a first side of said insulated metal substrate on which said first electronic components are mounted, and having second electronic components mounted on one or both sides of said printed board;

an insulation resin filling a space between said insulated metal substrate and said printed board; and wherein said at least one printed board laminated over said insulated metal substrate has a cut portion, and a substrate having thereon a through hole and an electrode pattern being fitted and buried in said cut portion.

9. A multilayered printed board structure as claimed in claim 8, wherein said printed board or said insulation layer of said insulated metal substrate is divided into at least first and second portions, said first portion containing electronic parts similar in first operational characteristics; and said second portion containing parts similar in second operation characteristics, said first and second operational characteristics being different; and said portions of said printed board or said insulating layer formed of materials differing in physical properties and selected in relation to the operational characteristics of said electronic parts of said portion.

10. A multilayered printed board structure as claimed in claim 8, wherein said insulation resin has a high thermal conductivity.

11. A multilayered printed board structure as claimed in claim 8, including a through hole formed in said at least one printed board to penetrate a conductor pattern provided on said at least one printed board.

12. A multilayered printed board structure as claimed in claim 8, further comprising a metallic pin for connecting conductor patterns provided on said boards facing to each other, said pin being buried along the thickness direction of said multilayered structure printed structure.

13. A multilayered printed board structure as claimed in claim 8, wherein said multilayered printed board structure has a monolithic structure formed by applying a vacuum press to said boards and said insulation resin incorporated as prepregs between each of said boards.

14. A multilayered printed board structure as claimed in claim 8, wherein said multilayered printed board structure has a monolithic structure formed by injecting said insulation resin into a shaping mold after placing therein said at least one printed board having said mounted electronic components.

15. A multilayered printed board structure as claimed in claim 8, wherein said insulated metal substrate is larger than an outer periphery of said at least one printed board and said insulation resin over said insulated metal substrate, and a conductor pattern formed on a surface of said insulated metal substrate is exposed to form a connecting portion with an external circuit.

16. A multilayered printed board structure, comprising:

an insulated metal substrate including an insulating layer laminated on a metallic plate as a base layer and a conductive layer on said insulating layer, and having first electronic components mounted on said insulated metal substrate;

at least one printed board laminated over a first side of said insulated metal substrate on which said first electronic components are mounted, and having second electronic components mounted on one or both sides of said printed board; and an insulation resin filling a space between said insulated metal substrate and said printed board, an outer edge of said insulated metal substrate being folded upward to provide a casing which surrounds said at least one printed board laminated over said insulated metal substrate.

17. A multilayered printed board structure as claimed in claim 16, said insulation resin having a high thermal conductivity.

18. A multilayered printed board structure as claimed in claim 16, wherein said printed board or said insulation layer of said insulated metal substrate is divided into at least first and second portions, said first portion containing electronic parts similar in first operational characteristics, and said second portion containing parts similar in second operation characteristics, said first and second operational characteristics being different; and said portions of said printed board or said insulating layer formed of materials differing in physical properties and selected in relation to the operational characteristics of said electronic parts of said portion.

19. A multilayered printed board structure as claimed in claim 16, wherein a through hole is formed in said at least one printed board to penetrate a conductor pattern provided on said at least one printed board.

20. A multilayered printed board structure as claimed in claim 16, said at least one printed board laminated over said insulated metal substrate having a cut portion, and a substrate having thereon a through hole and an electrode pattern fitted and buried in said cut portion.

21. A multilayered printed board structure as claimed in claim 16, further comprising a metallic pin for connecting conductor patterns provided on said boards facing to each other, said pin being burled along the thickness direction of said multilayered structure printed structure.

22. A multilayered printed board structure as claimed in claim 16, wherein said multilayered printed board structure has a monolithic structure formed by applying a vacuum press to said boards and said insulation resin incorporated as prepregs between each of said boards.

23. A multilayered printed board structure as claimed in claim 16, wherein said multilayered printed board structure has a monolithic structure formed by injecting said insulation resin into a shaping mold after placing therein said at least one printed board having said mounted electronic components.

24. A multilayered printed board structure as claimed in claim 16, wherein said insulated metal substrate is larger than an outer periphery of said at least one printed board and said insulation resin over said insulated metal substrate, and a conductor pattern formed on a surface of said insulated metal substrate being exposed to form a connecting portion with an external circuit.

* * * * *

UNITED STATES PATENT AND TRADEMARK OFFICE
CERTIFICATE OF CORRECTION

PATENT NO. : 5,672,414
DATED : September 30, 1997
INVENTOR(S) : Kenji OKAMOTO et al.

It is certified that error appears in the above-indentified patent and that said Letters Patent is hereby corrected as shown below:

Claim 21, column 17, line 20, "burled" should read --buried--.

Signed and Sealed this

Twenty-sixth Day of May, 1998

*Attest:*

BRUCE LEHMAN

*Attesting Officer*    *Commissioner of Patents and Trademarks*